United States Patent [19]

Herrin

[11] Patent Number: 4,774,558

[45] Date of Patent: Sep. 27, 1988

[54] THERMALLY-ACTIVATED, SHORTING DIODE SWITCH HAVING NON-OPERATIONALLY-ALTERABLE JUNCTION PATH

[75] Inventor: Jerry Herrin, Santa Ana, Calif.

[73] Assignee: Hughes Aircraft Company, Los Angeles, Calif.

[21] Appl. No.: 585,962

[22] Filed: Mar. 5, 1984

[51] Int. Cl.[4] ..................... H01L 23/12; H01L 23/02; H01L 23/48

[52] U.S. Cl. ........................................ 357/28; 357/74; 357/13; 357/86

[58] Field of Search ........................ 357/13, 28, 71, 86, 357/74, 51

[56] References Cited

U.S. PATENT DOCUMENTS 3,402,325 9/1968 Minks .................................... 357/13

3,575,645 4/1971 Doversberger et al. ............. 357/28

*Primary Examiner*—Andrew J. James

*Assistant Examiner*—S. V. Clark

*Attorney, Agent, or Firm*—S. M. Mitchell; M. J. Meltzer; A. W. Karambelas

[57] ABSTRACT

The present invention generally provides a thermally-activated, shorting-diode switch whose composite diode structure possesses a non-operationally-alterable junction path, and whose diode shorting is effectuated by temperature-sensitive companion elements. The diode structure includes a semiconductor diode element to which associated first and second lead substructures are both unalterably connected. When activated by the increased temperatures experienced by the diode structure upon conduction, the shorting elements establish a direct, diode-bypass connection between the lead substructures.

In a first more-specific embodiment, the shorting mechanism encompasses a solder preform which melts and flows over the diode structure when conduction-interval temperatures are generated. A second more-specific embodiment alternatively employs a temperature-responsive deformation mechanism which upon activation deflects a cantilevered segment of the first lead into diode-bridging contact with a companion segment of the second lead.

8 Claims, 1 Drawing Sheet

THERMALLY-ACTIVATED, SHORTING DIODE SWITCH HAVING NON-OPERATIONALLY-ALTERABLE JUNCTION PATH

BACKGROUND OF THE INVENTION

1. Field of the Invention

The invention relates in general to electrical fuses and in particular to thermally-activated, shorting-diode switches.

It is to be noted, however, that while the subject invention will be described with reference to particularized embodiments and end uses, the invention is not limited to such embodiments and uses. Those having ordinary skill in the art and access to the teachings of this specification will recognize additional implementations and utilizations within the invention's scope.

2. The Prior Art

In a number of situations where it is desired to provide a shorting function across any defective one of a plurality of series-connected battery cells, a critical requirement is that there be absolutely no interruption of circuit current flow during fuse operation. One such situation is a communications satellite in which stringent constraints often nedessitate system configurations such that even the briefest interruption in the current supplied to volatile processor circuitry would result in the irretrievable loss of basic operational capabilities. The constraints are a direct consequence of the inherently weight-limited nature of the typical satellite environment. Because the weight limitations preclude the use of supplemental current-maintenance devices, it is essential that the ultimately-employed battery-shorting mechanisms possess in themselves the needed continuous-current capability.

An unacceptable drawback of the prior diode-shorting fuses is that they provide no such absolute assurance against current interruption. Consider, for example, the device of U.S. Pat. No. 3,213,345. The fuse there includes an operationally-alterable lead component which must be physically displaced in order to establish the desired shorting contact. During the nonconductive, pre-shorting phase of device operation, the spring-like lead is held in electrical contact with a diode element by means of a temperature-sensitive solder bond. It is the interposed nature of the solder, together with the spring-induced, lateral shifting experienced by the lead, which creates the conceivable danger that during activation the device's circuit path will be momentarily interrupted. This danger would be intensified in the severe physical environment of a satellite where solder flow characteristics and lead displacement behavior could very well be altered by the extreme vibration, random orientation and centrifugal forces which are inherent aspects of typical flight profiles. As a result, the '345 device could not be employed where critical processing functions are at stake.

An unattrative alternative to such interruption-susceptible shorting devices is the continued utilization of conventional diode structures. While the non-operationally-alterable nature of such structures does provide an otherwise-acceptable degree of assurance against current interruption, their only "shorting" capability is by means of their low-resistance, forward-conduction state. It is again in the operationally-constrained spacecraft environment, especially as often compounded by the conventional, weight-intensive need to employ a multiplicity of diodes for battery-bypass purposes, that even the minimal power consumption associated with such low-resistance states necessitates equipment tradeofts resulting in unappealing restrictions on overall system capabilities.

It is apparent, therefore, that a need exists for diode switching devices having both absolute assurance against current interruption and a direct shorting capability.

SUMMARY OF THE INVENTION

The drawbacks of the prior art are overcome by the present invention which generally provides a thermally-activated, shorting diode switch whose composite diode structure possesses a non-operationally-alterable junction path, and whose diode shorting is effectuated by temperature-sensitive companion elements.

The diode structure includes a semiconductor diode element to which associated first and second lead substructures are both unalterably connected, with the unalterable nature of these connections thus assuring an uninterrupted flow of current under all operational circumstances. When activated by the increased temperatures experienced by the diode structure upon conduction, the associated shorting elements establish a direct, diode-bypass connection between the lead substructures.

In a first more-specific embodiment, the shorting mechanism encompases a solder preform which melts and flows over the diode structure when conduction-interval temperatures are generated. A second more-specific embodiment alternatively employs a temperature-responsive deformation mechaism which upon activation deflects a cantilevered segment of the first lead into diode-bridging contact with a companion segment of the second lead.

DETAILED DESCRIPTION

I. Invention fundamentals

Figure 1:
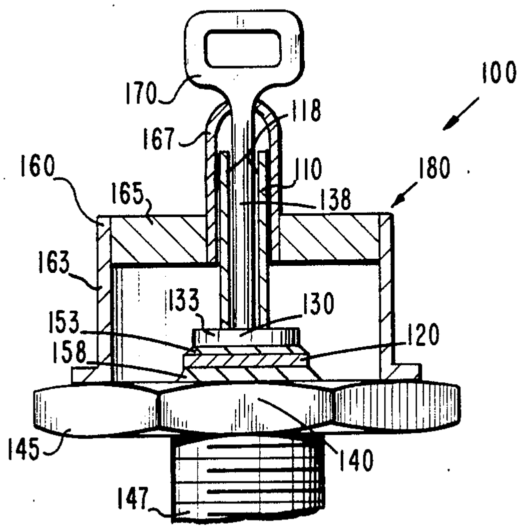
FIG. 1 shows one example embodiment in which thermally-responsive shorting is achieved by means of a solder preform which at diode-conduction temperatures melts and flows over the diode structure.

The thermally-activated, shorting diode switch provided by the invention generally encompasses a shorting mechanism in combination with a composite diode structure whose junction path is non-operationally-alterable. The diode structure itself includes a semiconductor diode element and two lead substructures. The lead substructures are respectively connected to first and second junction-definition regions of the diode element. The non-operationally-alterable nature of the junction path follows from the non-operationally-alterable nature of both of the diode-to-lead connections.

In accordance with conventional considerations, the diode structure, upon being forward biased, becomes conductive and experiences a temperature increase to a predeterminable interval. The associated inventive shorting mechanism is configured in general to be responsive to the temperatures of the diode structure. Because the mechanism's shorting action is desired at such time as when the diode begins to conduct, the shorting mechanism is configured in particular so that its shorting functions are actuated when the diode-structure temperatures reach the specified conduction interval. The shorting which thus selectively occurs when the identified temperatures are reached is effectuated by establishing a direct, diode-bypass connection between the two lead substructures.

II. Note on Coventional Assemblies

It may be noted preliminarily that certain conventional diode assemblies may be employed to realize various aspects of actual embodiments of the present invention. Thus in the first example embodiment of FIG. 1, the cross-sectioned composite unit 100, with the exception of below-described element 110, is illustrative of a commercially-available apparatus which may be conveniently adapted to the practice of the invention. The illustrated unit represents a member of the series of diode componets identifiable by the United States Joint Army Navy (JAN) part numbers 1N6304 through 1N6306 and available, for example, from the Unitrode Corporation of Lexington, Mass. (U.S.A.). Such a unit includes a semiconductor diode wafer 120 inherently having unillustrated first and second junction-definition regions to which respective first and second lead substructures 130 and 140 are unalterably joined by means of eutectic, solder bonds 153 and 158. The resulting diode-to-lead connections are non-operationally-alterable in the sense that except under extreme conditions such as outright destruction, the general mechanical configuration of the connections will not change in the course of ordinary switch operation.

It may be observed that because of their conductive nature, bonds 153 and 158 may in a formal sense be regarded as being operative parts of the respective lead substructures 130 and 140. It is to be noted furthermore that the lead substructures, in combination with the diode wafer, collectively comprise the invention's diode structure.

Lead substructure 140 more-specifically includes a metallic base 145 upon which case 160 is mounted. The case includes side walls 163, insulator segment 165 and pinch tube 167. Lead substructure 130 is held at its terminal end 170 by the pinch tube. Base 145 typically comprises the head of a threaded stud 147 which may be employed for mounting the composite assembly on external structures.

It may be supplementally noted that in actual implementations of the invention, the specific requirements of a given operational situation may prompt the introduction of modifications to these standard units. For example, with case 160 and base 145 together comprising a housing 180 for the composite assembly, it will at times be advantageous to configure this housing so that it creates an environment which provides a degree of thermal isolation for the below-described, thermally-sensitive mechanisms, as well as for the subject diode element enclosed within the housing. The desired isolation may be readily achieved through a straightforward application of such conventional expedients as replacing the metallic portions of case 160 with suitable known epoxy compositions and inserting ceramic or fiberglass washers of appropriate configuration between base 140 and an unillustrated mounting surface, or even between base 140 and a likewise unillustrated conductive washer upon which solder bond 158 had alternatively been formed.

A further degree of isolation could be achieved by reducing the thermally-conductive mass of various aspects of the lead substructures, especially, for example, that of base 145 and stud 147. It will be apparent, however, that any such mass reduction will often be subject to such countervailing considerations as the retention of sufficient mass both to satisfy specified electrical conductivity requirements and to provide protection of a thermal-delay type against transient environmental phenomenon such as the soldering of an external connection to terminal end 170 and thermal soak back to a host satellite from activated thruster mechanisms. It will similarly be more-generally apparent that the specific nature of the ensemble of insulative techniques utilized in any given situation will tend to be an often-subjective function of the particular operational requirements at hand.

It is to be noted that the concept of a thermally-isolated housing is directly contrary to the conventional practice of configuring certain aspects of the housing so as to enhance the degree of thermal transfer with respect to the ambient environment. In a more-typical operational situation, especially where pulsed currents are to be applied to the overall diode structure, the enhanced thermal transfer helps maintain device integrity by mitigating the cyclic, elevated temperature effects which the diode would otherwise experience in view of the quadratic relationship between device temperature and current. It may be noted parenthetically that in the design of the conventional diode-switching units, this temperature-migration function of the thermally-conductive housing would typically be complemented by the thermal-delay properties of an appropriately-configured base and stud assembly.

Where, however, as in a system configured in accordance with the present invention, the operational objective will frequently be that the overall assembly become and remain shortingly conductive upon the initial experience of current flow, protection against pulsed-current effects is usually irrelevant and the contrasting desire will often be to accentuate the heating effect so as to enhance the responsiveness of the assembly's thermally-activated shorting action. By trapping current-generated heat, a thermally-isolated housing can significantly contribute to such accentuated heating.

It is in any event with respect to the previously identified standard units that the invention may be realized by providing them with auxiliary elements which operate to achieve a temperature-activated, diode-shorting function. Two alternative classes of such shorting mechanisms will now be discussed.

III. Alternative Shorting Mechanisms

A. Solder Preform

A first more-specific realization of the invention provides that the shorting mechanism take the form of a solder preform. The preform is mounted so as to be thermally-responsive to the temperatures experienced by the diode structure, while the solder itself is of a type which is meltable at temperatures in the structure's conduction interval. The mounting is also in accordance with the criterion that upon melting the solder be able to flow over the diode structure and connectively contact both of the two lead substructures.

Thus in the example embodiment of FIG. 1, element 110 is the solder preform which is shown to be mounted so as satisfy the thermally-responsive and flow-contact criteria. The specific composition of the solder would be selected in accordance with empirical considerations arising out of the particular characteristics of the given operational situation. Consider, for example, the situation in which the inserting of preform 110 into housing 180 could be performed in a manufacturing stage which separately follows the eutectic bonding of lead substructures 130 and 140 to diode 120. In a circumstance of this nature, an enhanced degree of protection for the physical integrity of bonds 153 and 158, and hence an added degree of assurance of intended perform melting prior to device malfunction due to bond dissolution, could often be realized by choosing a solder composition such that perform 110 will melt at conduction temperatures well below the bond dissolution temperatures. It will often furthermore be convenient to select the composition such that the melting temperature is safely below the distruction temperatures of the diode 120 so that the diode's impurity diffusion is not adversely affected. A 40-60 lead-tin solder having a melting temperature of about 190° C. would be a very specific example of one of the many possible known solder compositions which could satisfy these exemplary empirical criteria.

With yet-more-particularized regard to the specifics of the example embodiment of FIG. 1, solder preform 110 is seen to be advantageously mounted adjacent the first lead substructure 130. The lead and the preform, together with the overall diode structure, are appropriately mutually configured so that the conduction-activated flow of solder onto the diode structure is by means of a capillary-type wicking action in which these same conduction-interval temperatures induce the molten solder to flow toward the diode heat source. It may be noted that this wicking action will tend to be induced regardless of either the orientation which the switch may assume or the externally originating forces to which the switch may be subject.

In its most-specific aspects, the first lead substructure 130 of switching unit 100 is seen to conventionally include a nail-type T-shaped member having a crossbar first portion 133 and an extended second portion 138. It is the first portion 133 which physically contacts diode 120 by means of interposed eutectic bond 153. For use in conjunction with a lead of this nature, solder preform 110 is conveniently made to possess an axial shaft 118 adapted to receive extended portion 138. In its adjacent-position mounting with respect to lead substructure 130, preform 110 is shown to be in the typical configuration of encircling portion 138 by means of the shaft 118. Because portion 138 is often conveniently given a substantially circular cross-section, preform 110 will often be provided with a complementary, substantially tubular volumetric geometry.

It may be noted that with preform 110 appropriately confined within the available interior volume defined in part by pinch tube 167 and extended portion 138, often no specific means for anchoring the preform need necessarily be employed. It may also be noted that due to the proximity of the preform to terminal 170, suitable expedients of a conventional nature may often be advisable to prevent the preform from melting prematurely during such operations as the soldering of connectors to the terminal. In addition to providing portion 138 and terminal 170 with sufficient thermal-delay mass as previously discussed, such expedients could include the use of thermal shunts to divert unwanted heat away from the preform region.

B. Deflectable Cantilevered Contact

A second more-specific realization of the invention provides that the shorting mechanism take the alternative form of a thermally-responsive deformation mechanism operating in conjunction with a cantilevered extension of one of the lead substructures. The desired bypass shorting is effectuated by configuring the deformation mechanism to deflect the cantilevered extension into diode-bridging contact with a companion segment of the other lead substructure.

Figure 2:
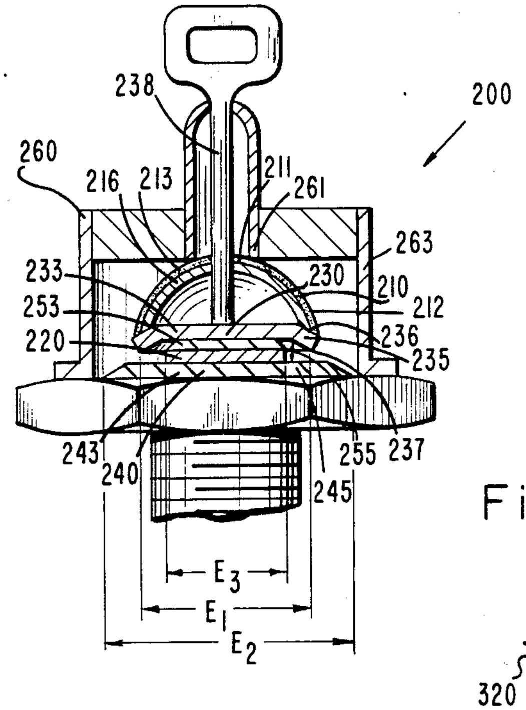
FIG. 2 shows another example embodiment in which the thermally-responsive shorting is alternatively achieved by means of a cantilevered lead segment which is deflected into diode-bridging contact by a temperature-sensitive deformation mechanism whose specific form is the illustrated arcuate bi-metallic member.

With reference to the example embodiment of FIG. 2, switch 200 is seen to be of the same general component makeup as switching unit 100 of FIG. 1. The following discussion, therefore, will tend to emphasize only those features of unit 200 which are of special relevance to an illustrative version of the alternative form of the shorting mechanism.

In this illustrative context, it becomes convenient to describe first and second lead substructures 230 and 240 as respectively including first and second diode-contact portions 233 and 243 which abut respective unillustrated first and second junction-definition regions in semiconductor diode element 220. The abutment of first contact portion 233 with diode element 220 is typically by way of eutectic solder bond 253, while second contact portion 243 may conveniently be comprised of the eutectic bonding material itself.

First contact portion 233 in turn includes a bypass subportion 235, while contact portion 243 analogously includes a bypass subportion 245. As will be more-fully described below, diode element 220, contact portions 233 and 243 and bypass subportions 235 and 245 are all mutually configured such that the subportions 235 and 245 are maintained in spaced yet brideage relationship.

In relation to contact portion 233, the first bypass subportion 235 is seen to comprise a portion segment which extends away from and is hence cantilevered with respect to the abutted diode element 220. As a cantilevered segment, subportion 235 is of a suitably bendable nature and is configured so that upon being selectively deflected by below-described deformation mechanism 210, the spacing 255 around diode element 220 and between subportions 235 and 245 is connectively bridged, thereby electrically bypassing the diode element.

A discussion of the specific features of the illustrated deformation mechanism may begin with the prerequisite specification that switch 200 include a leverage surface with respect to which the first contact portion 233 is mounted in fixed relationship. Several parts of the switch may ultimately be employed as this reference surface, with the choice in any given situation being dependent upon the particular employed form of the deformation mechanism. For the example mechanism 210 in its illustrated form, it becomes convenient to utilize the reference portion 261 of case 260 as the requisite leverage surface.

For the switch of FIG. 2, deformation mechanism 210 serves as the thermally-responsive portion of the subject shorting mechanism. Operatively interposed between example leverage surface 261 and cantilevered segment 235, deformation mechanism 210 is configured to become actuated when the temperatures of the diode structure, and hence in the structure's operational vicinity, reach the previously-described conduction interval. Upon thus being selectively actuated, the deformation mechanism is appropriately further configured to effectuate the bending of the cantilevered segment into diode-bypass electrical contact with the companion bypass subportion 245 of second contact 243.

It may be noted that with the diode-shorting functions being accomplished by the joint action of deformation mechanism 210, cantilevered segment 235 and second-contact bypass subportion 245, the presently discussed alternative realization of the shorting mechanism thus collectively comprises these three components.

Particularized characteristics of the illustrated deformation mechanism will now be discussed in a yet more specific manner. With the leverage surface having been specifically described as the reference portion 261 of case 260, it also becomes convenient to more narrowly describe this leverage portion as being disposed in its illustrated orientation facing and leveragely spaced from the first contact 233. In relation to a leverage portion of this nature, the deformation mechanism conveniently takes the depicted form of an arcuate, bi-metallic member which is itself concavely disposed with respect to contact 233.

This arcuate member possesses on one end a central leverage portion 211 which abuts the leverage surface 261. At its other arc end is a portion 212 which abuts, and ultimately applies force to, cantilevered segment 235. The interface point between arc end portion 212 and segment 235 is at a position sufficiently spaced from diode element 220 so that the required bending of segment 235 into contact with extension 245 can be effectuated.

It may be noted here parenthetically that among the substantially-equivalent realizations for the deformation mechanism in general and the illustrated version of the arcuate member 210 in particular would be configurations in which the leverage end 211 abutted either contact portion 233 itself or case side wall 263. Portion 233 or side 263 could then accordingly serve as the required leverage surface. It will conjunctively be apparent that member 210 could generally retain its illustrated concavity in an abutment with respect to portion 233, while abutment with respect to side 263 may conveniently employ a reversal in which the member was concave with respect to the side instead.

With regard again to the description of the illustrated mechanism, arcuate bi-metallic member 210 may be of a basically conventional nature, and yet specially configured so that the metal employed for its outer arc layer 213 possesses a coefficient of thermal expansion which is greater than that of the metal employed for the inner arc layer 216. This coefficient differential causes member 210, upon experiencing an increase in temperature, to undergo and increase in curvature. The change in curvature, combined with the bracing action of fixed leverage surface 261, in turn causes the desired bending force to be applied to cantilevered segment 235.

In an actual implementation, the metals would more specifically be chosen so that the coefficient differential between the metals, as well as the innate thermal responsivity characteristics of the metals themselves, are such as to provide member 210 with a degree of reactivity subjectively appropriate under the circumstances. Among the factors which might typically influence this choice are considerations such as first, the temperatures generated by the given diode structure upon conduction; second, the response time desired between conduction and short-circuiting; and third, the actual physical dimensions of the various switch components.

The description of the alternative shorting mechanism may be further particularized by specifying that first lead substructure 230 take the illustrated form of a substantially T-shaped member whose crossbar first submember 233 comprises the previously-described first contact portion. The complementary branch of the T-shaped member appears as extended submember 238. Crossbar submember 233, including cantilevered segment 235, would typically be symmetrically configured with respect to extension 238.

It is in convenient conjunction with a T-shaped member of this nature that the description may be still further particularized by specifying that the arcuate deformation member 210 possess a substantially dome-shaped volumetric geometry and be disposed in the depicted symmetrical, axially-straddling relationship with respect to the extended submember 238.

Another more-specific feature of the illustrated embodiment is that cantilevered segment 235 may advantageously be provided with a pre-flexed subsegment 236 which is angled toward the companion bypass subportion 245 of second contact 243. This pre-flexed configuration enables segment end point 237 to be disposed closer to bypass portion 245 than otherwise allowed by the separation distance 255 resulting from the inherent thickness of diode element 220 and its associated eutectic bonds. Because the pre-flexing thus reduces the amount of bending which segment 235 must undergo before making contact with subportion 245, the flexed condition improves the subject shorting action by consequentially reducing the time delay between the onset of conduction and the instant at which shorting is achieved.

It may be noted finally that although the diode element and its two associaed contact portions may take on a variety of volumetric geometries, it is often convenient to provide that, as illustrated, they possess simply a substantially planar shape. In a planar configuration of this nature, each of the three components will have a predetermined planar extent, where in consonance with the diode bypass considerations already discussed, the respective extents $E_1$ and $E_2$ of portions 233 and 243 are bridgeably greater than extent $E_3$ of the diode element 220. It also follows from this planar configuration that the previously discussed bypass subportion 245 may conveniently be regarded as an extension segment which is oversized with respect to the planar extend $E_3$ of diode element 220.

IV. Actual Operational Properties

Figure 3A:
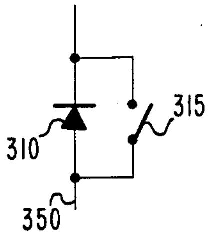
FIGS. 3*a* and 3*b* schematically illustrate circuit networks indicative of the true operational characteristics of inventively-configured versus prior-art configured shorting diode switches.
Figure 3B:
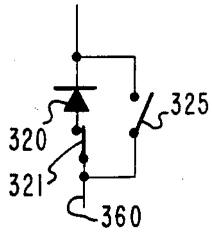

FIGS. 3*a* and 3*b* comparatively present schematic representations of the actual operational characteristics of two types of thermally activated diode shorting switches. The device type of FIG. 3*a* is indicative of the present invention and hence possesses a diode 310 which is unalterably connected to main circuit path 350. An uninterruptable flow of current through path 350 is thus assured regardless of the status of shorting bypass switch 315. In contrast, the device type of FIG. 3*b* is generally indicative of the effective properties of prior shorting switches such as that shown in the previously discussed U.S. Pat. No. 3,213,345. Besides diode 320 and shorting bypass switch 325, devices of this type effectively contain an "uncertainty switch" 321 which under certain circumstances can conceivably become opened at a time when switch 325 has not as yet closed. An uninterrupted flow of current through main circuit path 360 can thus not be assured.

V. claims

The preceding description has presented in detail exemplary preferred ways in which the concepts of the present invention may be applied. Those skilled in the art will recognize that numerous alternatives encompassing many variations may readily be employed without departing from the spirit and scope of the invention as set forth in the appended claims, in which:

What is claimed is:

1. A thermally-activated, shorting diode switch comprising:

(A) a diode structure;

(1) said structure including:

(a) a semiconductor diode element having first and second junction-definition regions; and (b) first and second lead substructures, respectively connected to said first and second junction-definition regions, where both of said connections are non-operationally-alterable; said first and second lead substrcutures respectively include first and second diode-contact portions which abut the respective junction-definition regions of said diode element, each of said portions in turn including a bypass subportion, with said diode element, said contact portions and said bypass subportions being mutually configured such that said subportions are maintained is spaced yet bridgeable relationship; the bypass subportion of said first contact portion including an extension segment cantilevered with respect to said abutting diode contact portion, said cantilevered segment being bendably configured to selectively bypass said diode element by connectively bridging said subportion-to-subportion spacing; said switch includes a leverage surface with respect to which said first contact portion is mounted in fixed relationship; with (2) said structure experiencing, upon conduction, a temperature increase to a predetermined interval; and (B) shorting means, responsive to the temperature of said diode structure and actuated by temperature in said conduction interval, for selectively establishing a diode-bypass connection between said first and second lead substructures said shorting means includes thermally-responsive deformation means, operatively interposed between said leverage surface and said cantilevered segment and actuated by said conduction-interval temperatures, for selectively bending said segment into diode-bypass electrical contact with the companion second-contact bypass subportion; whereby said shorting means comprises said deformation means in combination with both said cantilevered segment and said second-contact bypass subportion.

2. A switch according to claim 1 further including a housing which establishes a substantially thermally isolated environment for said shorting means and said diode structure.

3. A thermally activated shorting diode switch comprising:

a diode structure including a semiconductor diode element and first and second lead substructures permanently coupled to the diode element, the structure upon conduction having a temperature increase to a predetermined level; and a shorting mechanism mounted adjacent to at least one of the lead substructures, the mechanism including a bendable cantilevered member adjacent at least one of said lead substructures;

a bypass member adjacent to the structure and a deformation member which is leveragedly engaged with the cantilevered member, the deformation member upon the incease of temperature to a predetermined level cause the bending of the cantilevered member into the bypass member such that the first and second lead substructures are shorted and thereby bypassing the diode switch.

4. A switch according to claim 3 further including a housing which establishes a substantially thermally isolated environment for said shorting means and said diode structure.

5. A switch according to claim 1 in which:

(A) said switch further includes a housing, with said leverage surface comprising a reference portion of said housing, said leverage portion being disposed facing and leveragely spaced from said first contact portion;

(B) said deformation means comprises an arcuate, bi-metallic member, concavely disposed with respect to said first contact portion, this arcuate member having:

(1) a central leverage portion abutting said leverage surface, and (2) an arc-end, force-application portion abutting, at a position bendably spaced from said diode element, said cantilevered segment;

(C) said bi-metallic member having:

(1) an outer-arc layer of a first metal with a given coefficient of thermal expansion, and (2) an inner-arc layer of a second metal with a likewise-given expansion coefficient, said metals being selected so that said first coefficient is greater than said second coefficient.

6. A switch according to claim 5 in which:

(A) said first lead substructure comprises a substantially T-shaped member having:

(1) a crossbar first submember which in turn comprises said first diode-contact portion, and (2) an extended second submember, with said first contact portion, including said cantilevered segment, being symmetrically configured with respect to said extended submember; and (B) said arcuate deformation member possesses a substantially dome-shaped volumetric geometry and is disposed in symmetrical, axially-straddling relationship with respect to said extended submember.

7. A switch according to claim 1 in which:

said cantilevered segment includes a preflexed element angled toward said companion second-contact bypass subportion.

8. A switch according to claim 1 in which:

(A) said first and second contact portions and said diode element each possesses a substantially planar volumetric geometry, with each having a predetermined planar extent, and with the planar extent of both of said contact portions being bridgeably greater than that of said diode element; and in which (B) the bypass subportion of said second contact comprises an extension segment oversized with respect to the planar extent of said diode element.

* * * * *